(12) United States Patent
Antonyan

(10) Patent No.: US 8,929,127 B2
(45) Date of Patent: Jan. 6, 2015

(54) CURRENT GENERATOR FOR NONVOLATILE MEMORY DEVICE AND WRITE AND/OR READ CURRENTS CALIBRATING METHOD USING THE SAME

(71) Applicant: Artur Antonyan, Suwon-si (KR)

(72) Inventor: Artur Antonyan, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/242,854

(22) Filed: Apr. 1, 2014

(65) Prior Publication Data
US 2014/0321195 A1    Oct. 30, 2014

(30) Foreign Application Priority Data
Apr. 25, 2013 (KR) .................. 10-2013-0046218

(51) Int. Cl.
*G11C 11/00* (2006.01)
*G11C 13/00* (2006.01)

(52) U.S. Cl.
CPC ........ *G11C 13/0021* (2013.01); *G11C 13/0004* (2013.01); *G11C 13/0007* (2013.01); *G11C 13/0069* (2013.01)
USPC ....... 365/148; 365/171; 365/226; 365/189.09

(58) Field of Classification Search
CPC ........... G11C 13/0069; G11C 13/0004; G11C 13/0007
USPC .............................. 365/148, 171, 226, 189.09
See application file for complete search history.

(56) References Cited

U.S. PATENT DOCUMENTS

| 6,873,543 | B2 * | 3/2005 | Smith et al. | 365/158 |
|---|---|---|---|---|
| 7,200,066 | B2 * | 4/2007 | Krenzke et al. | 365/226 |
| 7,751,258 | B2 | 7/2010 | Tsuchida | |
| 7,760,543 | B2 | 7/2010 | Ueda | |
| 7,863,876 | B2 * | 1/2011 | Cook et al. | 323/280 |
| 7,920,417 | B2 | 4/2011 | Seo et al. | |
| 7,948,795 | B2 | 5/2011 | Hidaka | |
| 8,059,453 | B2 | 11/2011 | Wang et al. | |
| 8,184,490 | B2 | 5/2012 | Wang et al. | |
| 8,189,417 | B2 | 5/2012 | Oh et al. | |
| 8,194,439 | B2 | 6/2012 | Kim et al. | |
| 8,217,490 | B2 | 7/2012 | Bertin et al. | |
| 8,320,167 | B2 | 11/2012 | Rao et al. | |

(Continued)

*Primary Examiner* — Connie Yoha
(74) *Attorney, Agent, or Firm* — Renaissance IP Law Group LLP

(57) ABSTRACT

A write and/or read current generator for nonvolatile memory device, especially for Spin Transfer Torque Magnetoresistive Random Access Memory (STT-MRAM), may include a current supplying circuit which changes a level of a sample current, determines a resistance state change current of a sample bit cell based on a feedback signal obtained through the sample bit cell whose resistance state is changed according to a level of the sample current. The current supplying circuit may calibrate a write and/or read current of a memory cell in response to a sample current applied at a point of time when a resistance state of the sample bit cell is switched into another resistance state. A calibration circuit may generate the feedback signal indicating a resistance area of a predetermined resistance range to which a resistance state of the sample bit cell belongs. The calibration circuit may compare a sample voltage output from the sample bit cell with a voltage on predefined high resistance bit cell to output a first output voltage. The calibration circuit may compare the sample voltage with a voltage on predefined low resistance bit cell to generate a second output voltage. The calibration circuit may compare the first and second output voltages to generate the feedback signal.

18 Claims, 14 Drawing Sheets

(56) References Cited

U.S. PATENT DOCUMENTS

| | | | |
|---|---|---|---|
| 8,411,493 B2 | 4/2013 | Katti | |
| 8,710,819 B2 * | 4/2014 | Chen | 323/285 |
| 2008/0170429 A1 | 7/2008 | Bertin et al. | |
| 2009/0086532 A1 | 4/2009 | Tsuchida | |
| 2009/0091969 A1 | 4/2009 | Ueda | |
| 2009/0103354 A1 | 4/2009 | Yoon et al. | |
| 2010/0014363 A1 | 1/2010 | Wang et al. | |
| 2010/0214834 A1 | 8/2010 | Hidaka | |
| 2010/0220516 A1 | 9/2010 | Lee et al. | |
| 2010/0290280 A1 | 11/2010 | Seo et al. | |
| 2011/0116303 A1 | 5/2011 | Wang et al. | |
| 2011/0157971 A1 | 6/2011 | Kim et al. | |
| 2011/0280062 A1 | 11/2011 | Oh et al. | |
| 2012/0014174 A1 | 1/2012 | Rao et al. | |
| 2012/0287708 A1 | 11/2012 | Katti | |

\* cited by examiner

CURRENT GENERATOR FOR NONVOLATILE MEMORY DEVICE AND WRITE AND/OR READ CURRENTS CALIBRATING METHOD USING THE SAME

BACKGROUND

The inventive concepts described herein relate to a nonvolatile memory device, and more particularly, relate to a current generator of a nonvolatile memory device such as a resistive random access memory device and a write and/or read current calibrating method.

A magnetic random access memory (hereinafter, referred to as MRAM) may be a memory device that stores data using a resistance variation of a magnetic tunneling junction (hereinafter, referred to as MTJ) element of a memory cell. A resistance value of the MTJ element may vary according to a magnetization direction of a free layer. For example, when a magnetization direction of the free layer is parallel with that of a fixed layer, the MTJ element may have a relatively small resistance value. When a magnetization direction of the free layer is anti-parallel with that of the fixed layer, the MTJ element may have a relatively large resistance value. A relatively small resistance value of the MTJ element may correspond to data '0' and a relatively large resistance value may correspond to data '1'.

The MRAM may write data using a data writing method in which data is written at the MTJ element using a digit line. In the MRAM employing such a write manner, a current may be applied to a digit line spaced apart from the MTJ element to generate a magnetic field, and a magnetization direction of the free layer may be changed by the magnetic field. A read current may be applied between both ends of the MTJ element. In the MRAM, a read current path may be different from a write current path. However, in a spin transfer torque magnetic random access memory (hereinafter, referred to as STT-MRAM) not employing a digit line, a read current path may be equal to a write current path. For this reason, fine control on read and write currents would be desirable.

SUMMARY

An embodiment of the inventive concept is directed to provide a current generator for a nonvolatile memory device capable of self-calibrating a current and a write and/or read current calibrating method of the nonvolatile memory device.

One aspect of embodiments of the inventive concept is directed to provide a current generator including a current supplying circuit configured to gradually and incrementally change a level of a sample current from one discrete level to another. The current generator may further include a calibration circuit coupled to the current supplying circuit, wherein the calibration circuit includes a sample bit cell configured to receive the sample current, and wherein the calibration circuit further includes a feedback signal generating unit configured to generate and transmit a feedback signal to the current supplying circuit indicating a resistance state change current of the sample bit cell.

The current supplying circuit may determine the resistance state change current of the sample bit cell based on the feedback signal obtained from the calibration circuit.

The sample bit cell may receive a discrete level of the sample current to change a resistance state of the sample bit cell.

The current supplying circuit may calibrate at least one of a write current and a read current of a memory cell, in response to the discrete level of the sample current that is applied at a point of time corresponding to when the resistance state of the sample bit cell is switched into another resistance state.

The calibration circuit may generate the feedback signal indicating a resistance area of a predetermined resistance range to which the resistance state of the sample bit cell belongs.

The sample bit cell may output a sample voltage. The feedback signal generating unit may compare the sample voltage with a voltage associated with a predefined high resistance bit cell so as to generate a first output voltage, compare the sample voltage with a voltage associated with a predefined low resistance bit cell so as to generate a second output voltage, and compare the first and second output voltages so as to generate the feedback signal.

In example embodiments, the calibration circuit further comprises a reference voltage generator. The reference voltage generator may generate a first reference voltage and a second reference voltage. The first reference voltage may be a voltage output from a cell having a first resistance state in response to the read current. The second reference voltage may be a voltage output from a cell having a second resistance state, a resistance value of the second resistance state being larger than that of the first resistance state.

In example embodiments, the calibration circuit may include a reset current source which resets the sample cell.

In example embodiments, the current supplying circuit may include a counter, which may increase the sample current until the resistance state of the sample bit cell is switched into another resistance state, and generate a count value based on an increasing frequency of the sample current. The current supplying circuit may further include a replica circuit configured to provide a write current that is calibrated based on the count value.

In example embodiments, the current supplying circuit may include a resistor array including a plurality of resistors connected in parallel, and a switch array including a plurality of switches, each of the switches being connected in series to a corresponding one of the plurality of resistors, the switch array being configured to turn one or more of the switches on in response to a control of the counter.

In example embodiments, the resistor array is configured such that a total level of current flowing to the plurality of resistors is discretized.

In example embodiments, the current supplying circuit further comprises a voltage stabilizer, which can maintain a voltage provided to the plurality of resistors.

In example embodiments, the voltage stabilizer comprises an error amplifier to amplify a difference between a reference voltage and the voltage provided to the plurality of resistors.

In example embodiments, the replica circuit comprises a replica resistor array including a plurality of resistors connected in parallel; and a replica switch array including a plurality of switches, each of the switches being connected in series to a corresponding one of the plurality of resistors, the replica switch array being configured to turn one or more of the switches on in response to a control of the counter based on the count value.

One aspect of embodiments of the inventive concept is directed to provide a current calibrating method of a nonvolatile memory device, the memory device including a sample cell, a first comparator, and a second comparator. The method may include gradually and incrementally changing a sample current applied to the sample cell until a resistance state of the sample cell is changed. The method may further include calibrating at least one of a write current and a read current of the nonvolatile memory device in response to the changed sample current. Changing the sample current may include generating, by the sample cell, a sample voltage in response to a read current, comparing, by the first comparator, the sample voltage with a first reference voltage, outputting a first output voltage in response to the comparing, comparing, by the second comparator, the sample voltage with a second reference voltage, generating a second output voltage in response to the comparing, and determining the resistance state of the sample cell by comparing the first output voltage and the second output voltage.

In example embodiments, the write current calibrating method further comprises providing a reset current to the sample cell, and resetting the resistance state of the sample cell.

In example embodiments, the write current calibrating method further comprises calculating a count value based on a varying frequency of the sample current. Calibrating may further include calibrating the at least one of the write current and the read current of the nonvolatile memory device based on the count value.

In example embodiments, changing the sample current includes stepwise may include changing the sample current so that the sample current is increased by a discretization level until a resistance state of the sample cell is changed.

In example embodiments, calibrating may further include periodically calibrating the at least one of the write current and the read current of the nonvolatile memory device at predetermined time intervals.

In example embodiments, calibrating may further include periodically calibrating the at least one of the write current and the read current at a start-up operation of the nonvolatile memory device.

With embodiments of the inventive concept, since a current for data processing is self-calibrated, a data error due to a variation in a temperature and a time may be calibrated.

BRIEF DESCRIPTION OF THE FIGURES

The above and other advantages and features will become apparent from the following description with reference to the following figures, wherein like reference numerals refer to like parts throughout the various figures unless otherwise specified, and wherein.

DETAILED DESCRIPTION

Figure 1:
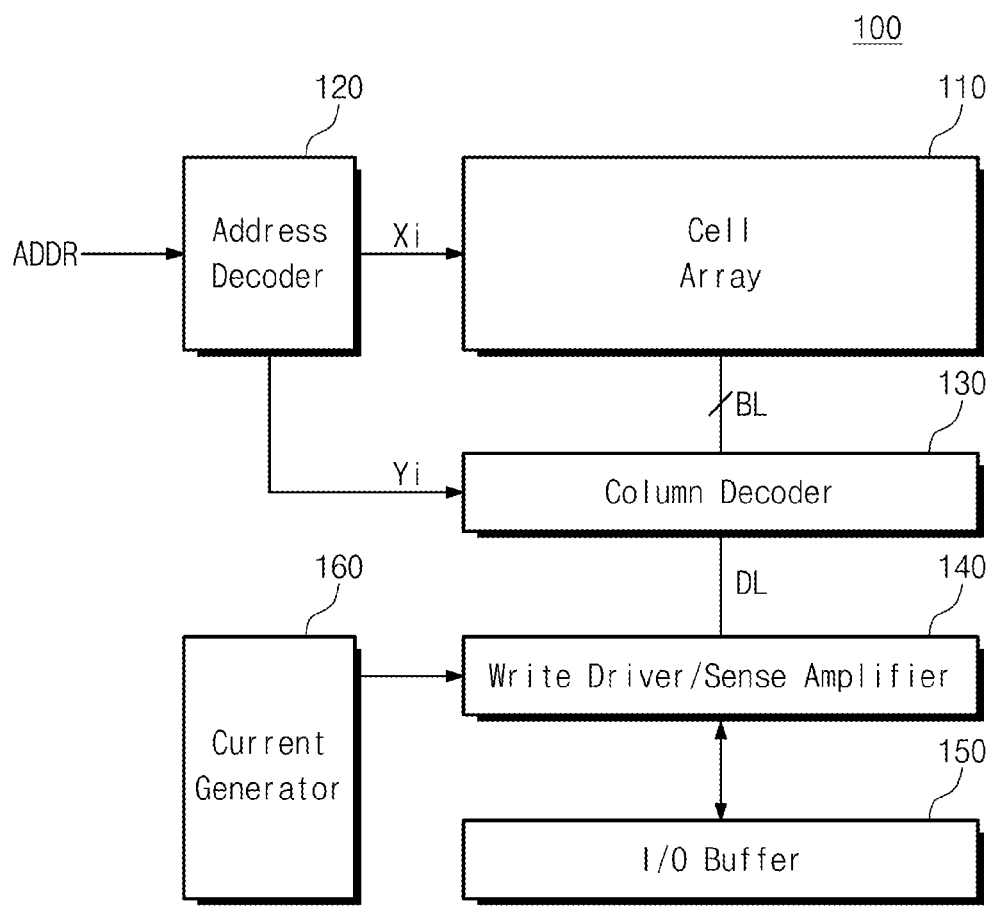
FIG. 1 is a block diagram schematically illustrating a nonvolatile memory device according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath," "below," "lower," "under," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on," "connected to," "coupled to," or "adjacent to" another element or layer, it can be directly on, connected, coupled, or adjacent to the other element or layer, or intervening elements or layers may be present. In contrast, when an element is referred to as being "directly on," "directly connected to," "directly coupled to," or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a nonvolatile memory device according to an embodiment of the inventive concept. Referring to FIG. 1, a nonvolatile memory device 100 may include a cell array 110, an address decoder 120, a column decoder 130, a write driver and sense amplifier block 140, an input/output buffer 150, and a current generator 160.

The nonvolatile memory device 100 may self-calibrate write and read current levels using a sample cell. For a self-calibration operation, the nonvolatile memory device 100 may sense a switching current level of the sample cell using reference cells having a plurality of resistance states. Write and read current levels used for a data processing operation of the nonvolatile memory device 100 may be decided based on a switching current level of a memory cell. The nonvolatile memory device 100 may calibrate read and write currents based on a switching current level of the sample cell to calibrate the influence due to a physical characteristic of a memory cell varied according to a temperature and a time.

The cell array 110 may include nonvolatile memory cells. For example, the cell array 110 may be formed of memory cells such as resistive memory cells (e.g., Phase Change Random Access Memory (PRAM) or Resistance Random Access Memory (RRAM) cells), Nano Floating Gate Memory (NFGM) cells, Polymer Random Access Memory (PoRAM) cells, Magnetic Random Access Memory (MRAM) cells, or Ferroelectric Random Access Memory (FRAM) cells.

In example embodiments, the cell array 110 may be formed of Spin Transfer Torque Magneto Resistive Random Access Memory (STT-MRAM) cells. The STT-MRAM cells are more fully described below with reference to FIGS. 2 to 5.

The memory cells in the cell array 110 may be selected by a row address Xi and a column address Yi. At least one word line may be selected by the row address Xi, and at least one bit line may be selected by the column address Yi.

The address decoder 120 may decode an input address ADDR into the row address Xi and the column address Yi. The address decoder 120 may select one of the word lines according to the row address Xi. Also, the address decoder 120 may output the column address Yi to the column decoder 130. The column decoder 130 may select a data line DL with a selected bit line BL in response to the column address Yi.

The write driver and sense amplifier block 140 may receive data from the input/output buffer 150 at a program operation. The write driver and sense amplifier block 140 may be supplied with a write current for writing input data at a selected memory cell from the current generator 160.

The write driver and sense amplifier block 140 may sense data written at the selected memory cell. The write driver and sense amplifier block 140 may amplify the sensed data to convert it into a binary logic value. The write driver and sense amplifier block 140 may transfer the converted data to the input/output buffer 150.

The write driver and sense amplifier block 140 may provide a read current to the data line DL to read data of the selected memory cell. The write driver and sense amplifier block 140 may compare a voltage of the data line DL measured using the read current with a reference voltage. The write driver and sense amplifier block 140 may decide what data (e.g., a logical 0 or a logical 1) was written at a memory cell according to a result of the comparison. The write driver and sense amplifier block 140 may be supplied with read current from the current generator 160, which itself may be supplied to the data line DL.

The input/output buffer 150 may temporarily store input data to transfer it to the write driver and sense amplifier block 140. Also, the input/output buffer 150 may temporarily store output data provided from the write driver and sense amplifier block 140 to transfer it to an external device.

The current generator 160 may generate the write current and the read current that are provided to the write driver and sense amplifier block 140. Levels of the write current and the read current generated from the current generator 160 may be decided based on a level of a switching current of a memory cell. The current generator 160 of the inventive concept may self-calibrate a level of a switching current using a sample cell, so that influences due to a physical characteristic of a memory cell, which may vary according to a temperature and a time, are accounted for. For a self-calibration operation, the current generator 160 may sense a resistance state of the sample cell using reference cells having a plurality of resistance states.

Also, the current generator 160 may perform a current calibration operation at a start-up operation of the nonvolatile memory device 100, and/or the current generator 160 may periodically perform a current calibration operation at predetermined time intervals.

Figure 2:
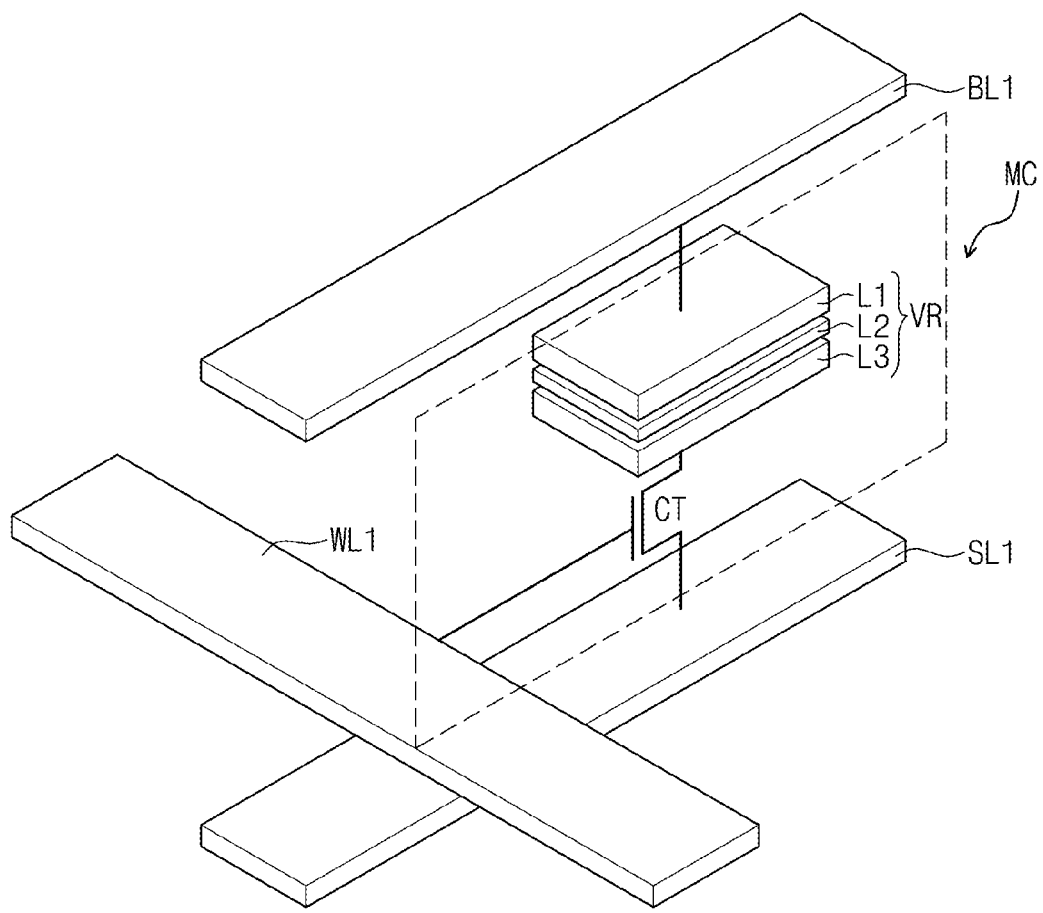
FIG. 2 is a diagram schematically illustrating a memory cell of a cell array of FIG. 1 according to an embodiment of the inventive concept.

FIG. 2 is a diagram schematically illustrating a memory cell MC of a cell array of FIG. 1 according to an embodiment of the inventive concept. In FIG. 2, the memory cell MC may be an STT-MRAM cell.

The memory cell MC may include a variable resistance element VR and a cell transistor CT. A gate of the cell transistor CT may be connected with a word line (e.g., WL1). One electrode of the cell transistor CT may be connected with a bit line (e.g., BL1) through the variable resistance element VR, and the other electrode thereof may be connected with a source line (e.g., SL1).

The variable resistance element VR may include a free layer L1, a fixed layer L3, and a tunnel layer L2 interposed between the free layer L1 and the fixed layer L3. A magnetization direction of the fixed layer L3 may be fixed. A magnetization direction of the free layer L1 may be parallel or anti-parallel relative to a magnetization direction of the fixed layer L3 according to a condition. The variable resistance element VR may further include an anti-ferromagnetic layer (not shown) to fix a magnetization direction of the fixed layer L3.

At a read operation, a high-level voltage may be applied to the word line WL1. In response to the high-level voltage, the cell transistor CT may be turned on. Also, a read current may be provided in a direction from the bit line BL1 to the source line SL1 to measure a resistance value of the variable resistance element VR. Data stored at the variable resistance element VR may be determined according to the measured resistance value.

At a write operation, a high-level voltage may be applied to the word line WL1. In response to the high-level voltage, the cell transistor CT may be turned on. Also, a write current may be provided between the bit line BL1 and the source line SL1 to change a resistance value of the variable resistance element VR. Below, the read and write operations are more fully described with reference to FIGS. 3 to 5.

Figure 3:
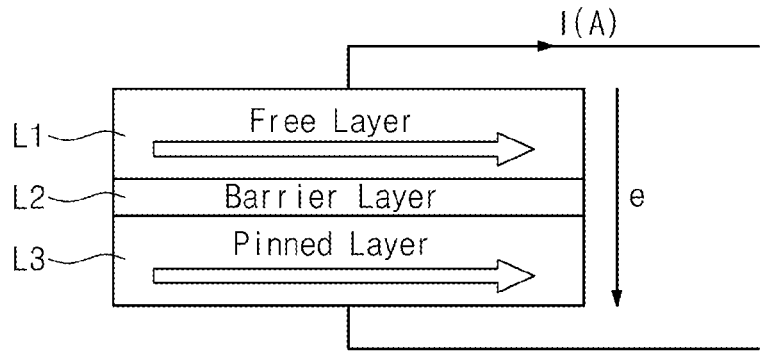
FIGS. 3 and 4 are diagrams illustrating magnetization directions of a variable resistance element according to data stored at a memory cell of FIG. 2.
Figure 4:
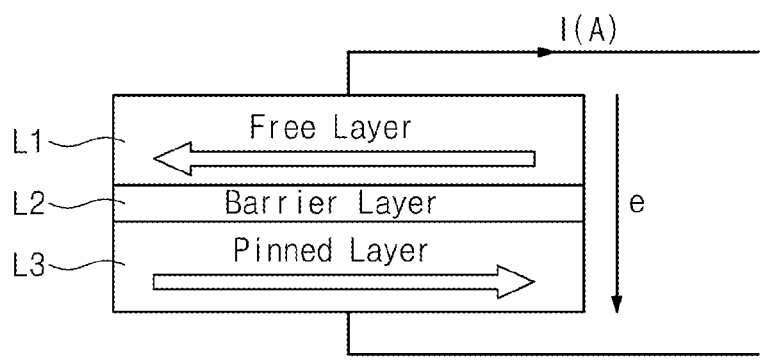

FIGS. 3 and 4 are diagrams illustrating magnetization directions of a variable resistance element VR according to data stored at a memory cell of FIG. 2.

A resistance value of a variable resistance element VR may vary according to a magnetization direction of a free layer L1. If a read current I is provided to the variable resistance element VR, there may be output a data voltage corresponding to a resistance value of the variable resistance element VR. Since a read current level is lower than a write current level, in general, a magnetization direction of the free layer L1 may not vary.

Referring to FIG. 3, a magnetization direction of the free layer L1 may be parallel with a magnetization direction of a fixed layer L3. Thus, the variable resistance element VR may have a small resistance value. In this case, data '0' may be read out from a memory cell MC, for example.

Referring to FIG. 4, a magnetization direction of the free layer L1 may be anti-parallel with a magnetization direction of the fixed layer L3. Thus, the variable resistance element VR may have a large resistance value. In this case, data '1' may be read out from the memory cell MC, for example.

In FIGS. 3 and 4, an example structure is illustrated in which the free layer L1 and the fixed layer L3 of the variable resistance element VR are formed of horizontal magnetic elements. However, the inventive concept is not limited thereto. For example, the free layer L1 and the fixed layer L3 of the variable resistance element VR can be formed of vertical magnetic elements.

Figure 5:
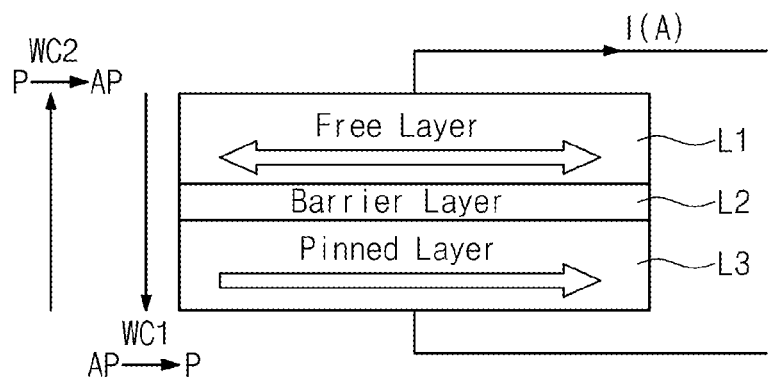
FIG. 5 is a diagram describing a write operation on a memory cell of FIG. 2.

FIG. 5 is a diagram describing a write operation on a memory cell MC of FIG. 2.

Referring to FIG. 5, a magnetization direction of a free layer L1 may be decided according to a direction of a write current WC1 and/or WC2, which may flow through a variable resistance element VR. For example, if a first write current WC1 is provided, free electrons having the same spin direction as a fixed layer L3 may apply torque to the free layer L1. As a result, the free layer L1 may be magnetized to be parallel with the fixed layer L3.

If a second write current WC2 is provided, free electrons having a spin direction opposite to that of the fixed layer L3 may apply torque to the free layer L1. As a result, the free layer L1 may be magnetized to be anti-parallel with the fixed layer L3. That is, a magnetization direction of the free layer L1 in the variable resistance element VR may be changed by spin transfer torque.

Figure 6:
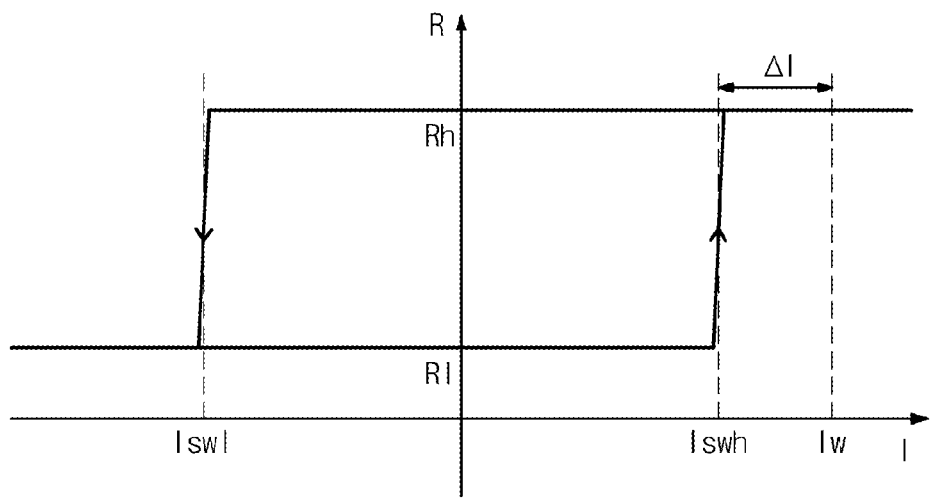
FIG. 6 is a graph illustrating the relation between a current flowing to a variable resistance element and a resistance value of the variable resistance element.

FIG. 6 is a graph illustrating the relation between a current flowing to a variable resistance element VR and a resistance value of the variable resistance element. In FIG. 6, a horizontal axis may indicate a current flowing to a variable resistance element VR, and a vertical axis may indicate a resistance value.

As described with reference to FIGS. 3 and 5, the variable resistance element VR may have two resistance states according to a magnetization direction of a free layer L1 (e.g., of FIG. 3). For example, the variable resistance element VR may have a low resistance state and a high resistance state.

For example, the variable resistance element VR may exist at a low resistance state when a magnetization direction of the free layer L1 is parallel with a magnetization direction of a fixed layer L3 (e.g., of FIG. 3). At the low resistance state the variable resistance element VR may have a first resistance value Rl. The variable resistance element VR may exist at a high resistance state when a magnetization direction of the free layer L1 is anti-parallel with a magnetization direction of the fixed layer L3. At the high resistance state the variable resistance element VR may have a second resistance value Rh.

As described with reference to FIG. 5, if a sufficient level of current is applied to the variable resistance element VR having a low resistance state, a state of the variable resistance element VR may be switched into a high resistance state. In this specification, a minimum current capable of changing the first resistance value Rl of the variable resistance element VR into the second resistance value Rh may be referred to as a high switching current Iswh.

If a sufficient level of current is applied to the variable resistance element VR having a high resistance state, a state of the variable resistance element VR may be switched into a low resistance state. In this specification, a minimum current capable of changing the second resistance value Rh of the variable resistance element VR into the first resistance value Rl may be referred to as a low switching current Iswl. A direction of the high switching current Iswh may be opposite to that of the low switching current Iswl.

Below, the high switching current Iswh and a write current Iw corresponding to the high switching current Iswh are further described. It will be understood that similar techniques are applicable to the low switching current Iswl and a write current corresponding to the low switching current Iswl without departing from the inventive concept.

A level of a write current Iw for changing a resistance state of the variable resistance element VR from a low state to a high state should be higher than that of the high switching current Iswh. To improve the reliability of a write operation, there may be provided a write current Iw having a level higher by a predetermined calibration value $\Delta l$ than that of the high switching current Iswh, as shown in FIG. 6.

A physical characteristic of the variable resistance element VR may vary according to a variation in a time and/or temperature. As a physical characteristic of the variable resistance element VR varies, a level of a switching current of the variable resistance element VR may vary.

Figure 7:
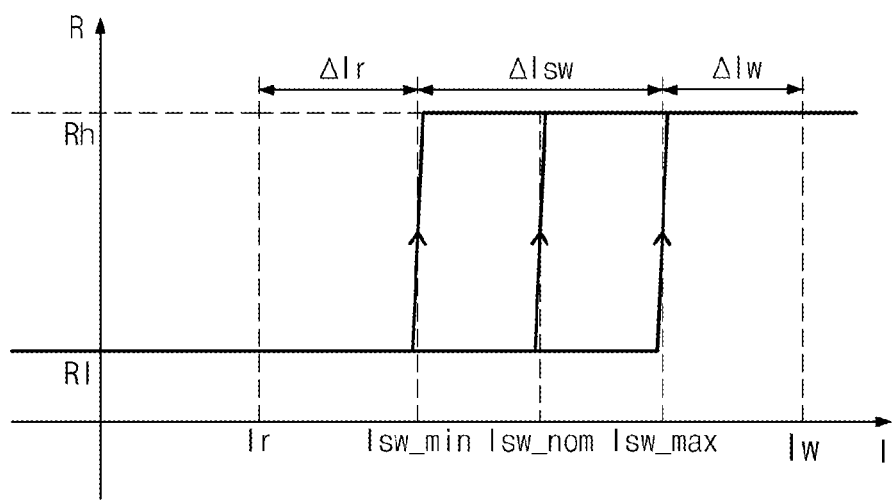
FIG. 7 is a graph illustrating a variation in a switching current of a variable resistance element.

FIG. 7 is a graph illustrating a variation in a switching current of a variable resistance element. A switching current may indicate a minimum current for changing a first resistance value Rl of a variable resistance element VR into a second resistance value Rh. In FIG. 7, a horizontal axis may indicate a current flowing to the variable resistance element VR and a vertical axis may indicate a resistance value.

Referring to FIG. 7, the switching current of the variable resistance element VR may have various values within a range ΔIsw between a minimum switching current Isw_min and a maximum switching current Isw_max.

To improve the reliability of a write operation, a write current Iw may be provided, which may have a level that is higher by a predetermined calibration value ΔIw than that of the maximum switching current Isw_max. If a level of the write current Iw is decided based on a level of the maximum switching current Isw_max, the reliability of the write current Iw may be guaranteed even at the worst case. However, if a level of the write current Iw is decided based on a level of the maximum switching current Isw_max, a current may be consumed unnecessarily. That is, power efficiency may be lowered.

To prevent a state of the variable resistance element VR from being changed at a read operation, a read current Ir may be provided, which may have a level that is lower by a predetermined calibration value ΔIr than that of the minimum switching current Isw_min. If the read current Ir is decided based on a level of the minimum switching current Isw_min, a variation in a state of the variable resistance element VR may be minimized even at the worst case. However, if the read current Ir is decided based on a level of the minimum switching current Isw_min, a low level of read current Ir may be provided. Thus, the reliability of a read operation may be lowered.

To improve the power efficiency and the data processing reliability, a current generator 160 (e.g., of FIG. 1) of the inventive concept may sense a variation in a switching current of a memory cell. The current generator 160 may generate a read current and/or a write current in response to the sensed switching current.

Figure 8:
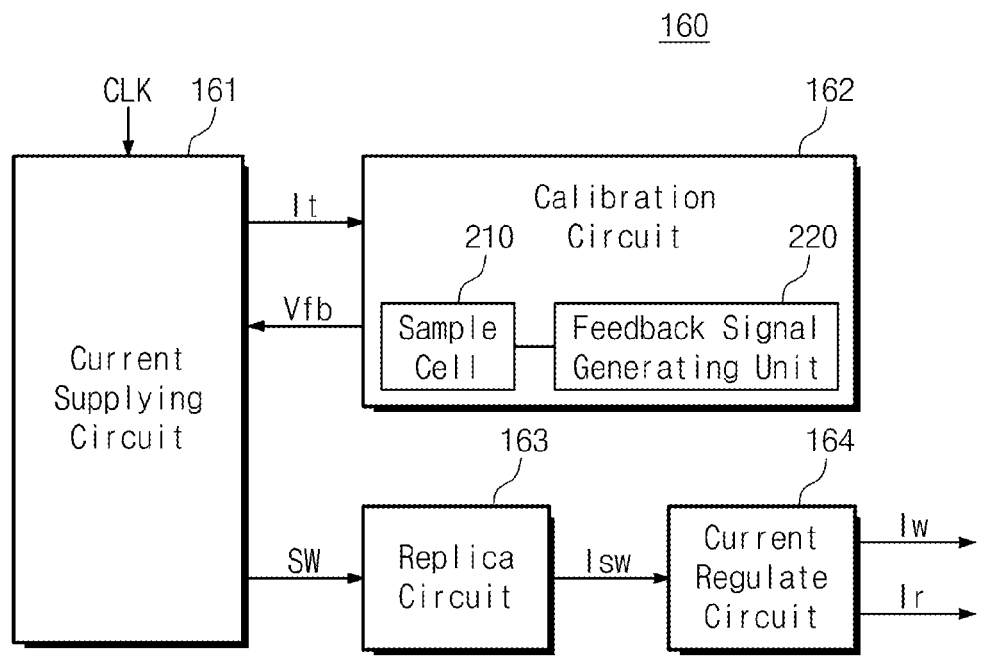
FIG. 8 is a block diagram schematically illustrating a current generator according to an embodiment of the inventive concept.

FIG. 8 is a block diagram schematically illustrating a current generator 160 according to an embodiment of the inventive concept. Referring to FIG. 8, a current generator 160 may include a current supplying circuit 161, a calibration circuit 162, a replica circuit 163, and a current regulate circuit 164.

The current generator 160 may periodically self-calibrate a switching current Isw generated from the replica circuit 163 using the calibration circuit 162, which itself may include a sample cell 210 (sometimes referred to herein as a "sample bit cell"). For a self-calibration operation, the current generator 160 may sense a switching current of the sample cell 210 using reference cells having a plurality of resistance states.

The current supplying circuit 161 may provide a test current It (sometimes referred to herein as a "sample current") to the calibration circuit 162. The test current It may be a write current for changing a resistance state of the sample cell 210 in the calibration circuit 162. The current supplying circuit 161 of the inventive concept may change a level of the test current It. A level of the test current It may be discretized to N bits (N being a predetermined natural number). For example, the test current It generated by the current supplying circuit 161 may have one of ($2^N$−1) levels.

The current supplying circuit 161 may determine whether a resistance state of the sample cell 210 is varied, using a feedback signal Vfb provided from the calibration circuit 162. The current supplying circuit 161 may gradually and/or incrementally increase a level of the test current It until a state of the sample cell 210 is varied. The current supplying circuit 161 may store a level of the test current It at a point of time when a state of the sample cell 210 is varied.

The current supplying circuit 161 may provide a switch signal SW to the replica circuit 163. The switch signal SW may be a signal directing a level of the test current It at a point of time when a state of the sample cell 210 is varied. The current supplying circuit 161 may control the replica circuit 163 such that a self-calibrated switching current Isw is generated from the replica circuit 163 using the switch signal SW. A detailed operation of the current supplying circuit 161 is more fully described below with reference to FIG. 12.

The calibration circuit 162 may include the sample cell 210 and a feedback signal generating unit 220. The calibration circuit 162 may provide the test current It provided from the current supplying circuit 161 to the sample cell 210. The calibration circuit 162 may provide the current supplying circuit 161 with a measuring result on a resistance value of the sample cell 210 output in response to the test current It as the feedback signal Vfb. A detailed operation of the calibration circuit 162 is more fully described below with reference to FIG. 9.

The sample cell 210 may be a reference cell used to track a variation of memory cells in a cell array 110 (e.g., of FIG. 1). The sample cell 210 may have the same physical characteristic as that of a memory cell in the cell array 110.

The feedback signal generating unit 220 may generate the feedback signal Vfb for determining a resistance state of the sample cell 210. The feedback signal Vfb may include information indicating whether a resistance value of the sample cell 210 is closer to any one of (i) a resistance value corresponding to a low resistance state Rl (e.g., of FIG. 6) and (ii) a resistance value corresponding to a high resistance state Rh (e.g., of FIG. 6). The feedback signal generating unit 220 of the inventive concept may generate the feedback signal Vfb using a plurality of reference cells. For example, the plurality of reference cells can include a reference cell having a low resistance state and a reference cell having a high resistance state. The feedback signal generating unit 220 is more fully described below with reference to FIG. 10.

The replica circuit 163 may generate a switching current Isw in response to the switch signal SW from the current supplying circuit 161. A level of the switching current Isw generated by the replica circuit 163 may be decided based on the switch signal SW. The replica circuit 163 may generate a self-calibrated switching voltage current Isw using the switch signal SW. The replica circuit 163 is more fully described below with reference to FIG. 14.

The current regulate circuit 164 may generate a write current Iw and a read current Ir using the switching current Isw provided from the replica circuit 163. The current regulate circuit 164 may generate the write current Iw and the read current Ir in response to regulation of the switching current Isw based on a predetermined calibration value.

The above-described current generator 160 may periodically self-calibrate the switching current Isw generated from the replica circuit 163 using the calibration circuit 162 including the sample cell 210. For a self-calibration operation, the calibration circuit 162 of the current generator 160 may sense a resistance state of the sample cell 210 using reference cells having a plurality of resistance states. The current generator 160 may calibrate a variation in a memory cell due to a variation in temperature and/or time by self-calibrating the switching current Isw using the sample cell 210.

The current generator 160 may perform a current calibration operation at a start-up operation of a nonvolatile memory device 100. Alternatively, or in addition, the current generator 160 may periodically perform a current calibration operation at predetermined time intervals.

Figure 9:
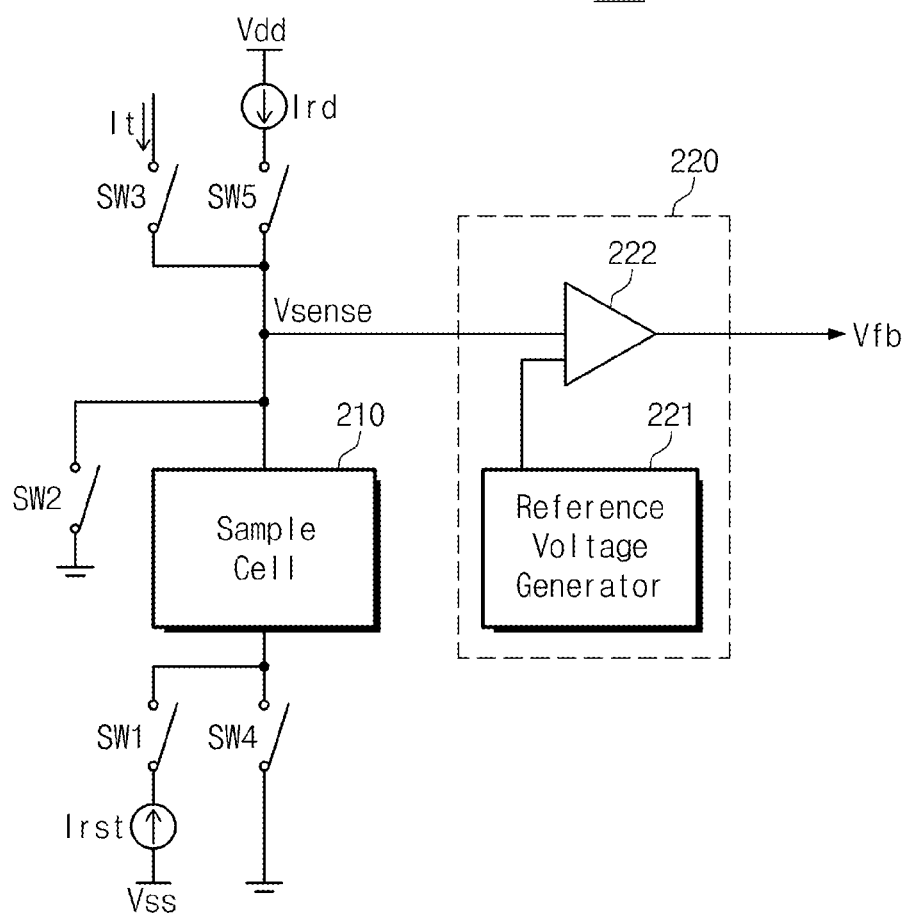
FIG. 9 is a circuit diagram schematically illustrating a calibration circuit according to an embodiment of the inventive concept.

FIG. 9 is a circuit diagram schematically illustrating a calibration circuit according to an embodiment of the inventive concept. Referring to FIG. 9, a calibration circuit 162 may include a sample cell 210, a feedback signal generating unit 220, first to fifth switches SW1 to SW5, a reset current source Irst, and a read current source Ird.

The calibration circuit 162 may measure a witching current of the sample cell 210. The calibration circuit 162 may provide the sample cell 210 with a test current It via SW3 supplied from a current supplying circuit 161 (e.g., of FIG. 8). The calibration circuit 162 may sense a variation in a resistance state of the sample cell 210 in response to the test current It.

The feedback signal generating unit 220 of the calibration circuit 162 may sense a resistance state of the sample cell 210 using reference cells having a plurality of resistance states. The calibration circuit 162 may provide the current supplying circuit 161 with information associated with a resistance state of the sample cell 210 output in response to the test current It, as a feedback signal Vfb.

Prior to applying the test current It, the calibration circuit 162 may reset the sample cell 210 to a low resistance state. The reset current source Irst, the first switch SW1 and the second switch SW2 may constitute a reset current route for resetting the sample cell 210 to a low resistance state.

The reset current source Irst may supply a write current for writing the sample cell 210 to the low resistance state. The first switch SW1 may be connected between the reset current source Irst and the sample cell 210. The second switch SW2 may be connected between the sample cell 210 and ground.

At a rest operation, the first switch SW1 and the second switch SW2 may be closed to provide a route through which a write current from the reset current source Irst flows to ground from the sample cell 210. The sample cell 210 may be reset to a low resistance state by the write current from the reset current source Irst.

As described above, a test current It may be provided from the current supplying circuit 161 to measure a switching current of the sample cell 210. The calibration circuit 162 may apply the test current It to the sample cell 210. The third switch SW3 and the fourth switch SW4 may constitute a test current route for providing the test current It to the sample cell 210.

The third switch SW3 may be connected between the current supplying circuit 161 and the sample cell 210. The fourth switch SW4 may be connected between the sample cell 210 and ground. At a test operation on the sample cell 210, the third switch SW3 and the fourth switch SW4 may be closed. The third and fourth switches SW3 and SW4 closed may constitute a route through which the test current It of the current supplying circuit 161 flows from the sample cell 210 to ground. During the test operation, the first and second switches SW1 and SW2 may be opened to separate the reset current source Irst from the sample cell 210.

After the test operation, the calibration circuit 162 may sense a resistance value of the sample cell 210 varied in response to the test current It. The read current source Ird, the fourth switch SW4, and the fifth switch SW5 may constitute a read current route for sensing a resistance value of the sample cell 210.

At a sensing operation, the fourth switch SW4 and the fifth switch SW5 may be closed such that a read current from the read current source Ird flows to ground through the sample cell 210. During the sensing operation, the first to third switches SW1 to SW3 may be opened to separate the reset current source Irst and the test current It from the sample cell 210.

At the sensing operation, a sensing voltage Vsense may be decided based on the read current and a resistance value of the sample cell 210. The feedback signal generating unit 220 may compare the sensing voltage Vsense with reference voltages.

The feedback signal generating unit 220 may output a comparison result as the feedback signal Vfb.

The feedback signal generating unit 220 may include a reference voltage generator 221 and a comparator 222. The reference voltage generator 221 may generate a plurality of reference voltages for sensing a resistance state of the sample cell 210. The reference voltage generator 221 may provide the reference voltages to the comparator 222. The comparator 222 may generate the feedback signal Vfb based on the sensing voltage Vsense and the reference voltages. This technique is more fully described below with reference to FIG. 10.

Figure 10:
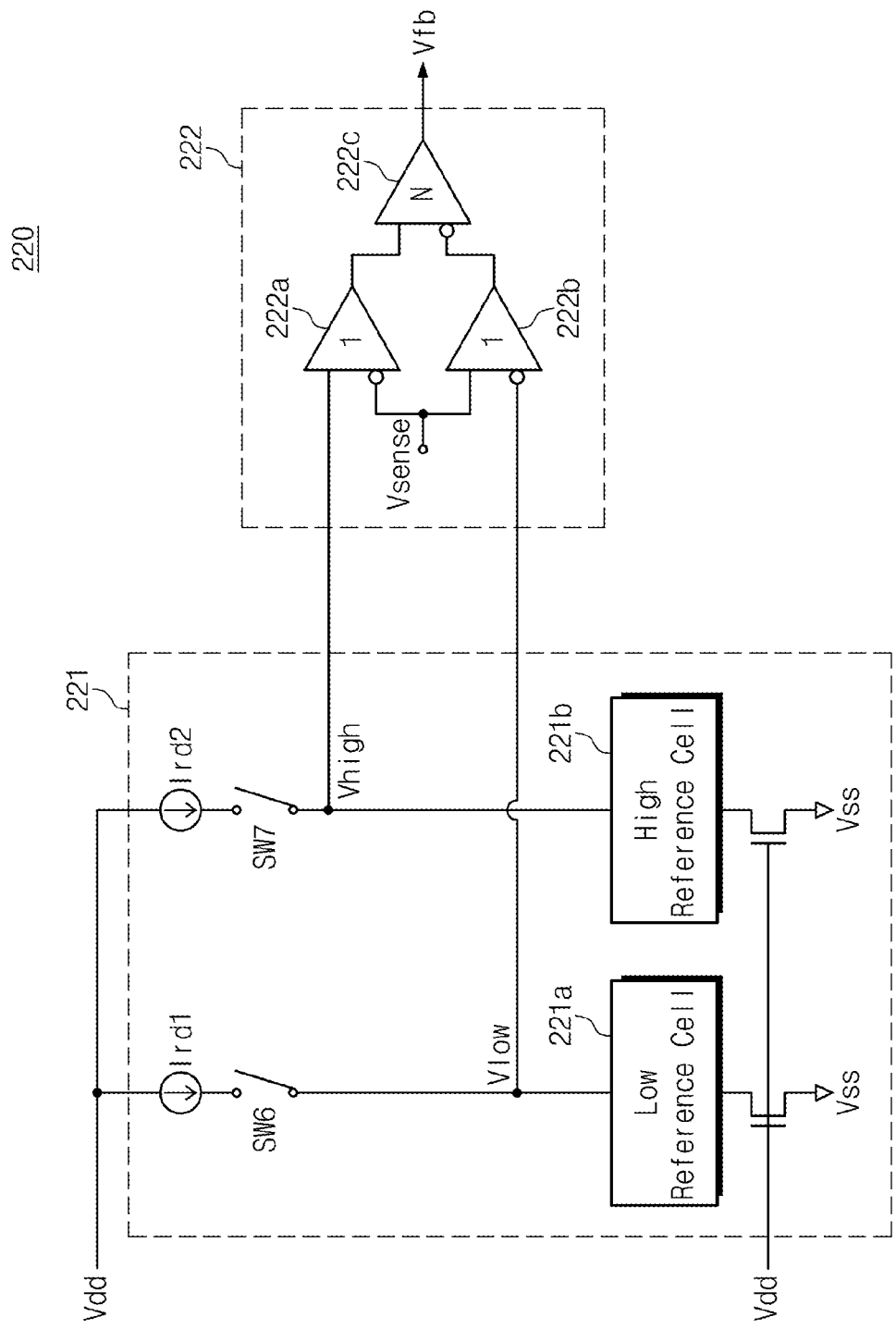
FIG. 10 is a circuit diagram schematically illustrating a feedback signal generating unit of FIG. 9.

FIG. 10 is a circuit diagram schematically illustrating a feedback signal generating unit of FIG. 9. Referring to FIG. 10, a feedback signal generating unit 220 may include a reference voltage generator 221 and a comparator 222.

The reference voltage generator 221 may include first and second read current sources Ird1 and Ird2, sixth and seventh switches SW6 and SW7, a low reference cell 221a, and a high reference cell 221b. The reference voltage generator 221 may generate a plurality of reference voltages (e.g., Vlow and Vhigh) for sensing a resistance state of a sample cell 210 using the reference cells 221a and 221b.

The low reference cell 221a may be a memory cell having a low resistance state. The high reference cell 221b may be a memory cell having a high resistance state. The sixth switch SW6 may be connected between the first read current source Ird1 and the low reference cell 221a. The seventh switch SW7 may be connected between the second current source Ird2 and the high reference cell 221b.

The first and second read current sources Ird1 and Ird2 may provide read currents to the low and high reference cells 221a and 221b, respectively, in response to closing or opening of the sixth and seventh switches SW6 and SW7, respectively. The low and high reference cells 221a and 221b may output low and high reference voltages Vlow and Vhigh, respectively, in response to the read currents of the low and high reference cells 221a and 221b, respectively.

The comparator 222 may compare a sensing voltage Vsense from a calibration circuit 162 (e.g., of FIG. 9) with the reference voltages Vlow and Vhigh. The comparator 222 may output a comparison result as a feedback signal Vfb. The comparator 222 may comprise a first comparator 222a, a second comparator 222b, and a third comparator 222c.

The first comparator 222a may compare the high reference voltage Vhigh with the sensing voltage Vsense. The first comparator 222a may output a difference between the high reference voltage Vhigh and the sensing voltage Vsense.

The second comparator 222b may compare the low reference voltage Vlow with the sensing voltage Vsense. The second comparator 222b may output a difference between the low reference voltage Vlow and the sensing voltage Vsense.

The third comparator 222c may compare outputs of the first comparator 222a and the second comparator 222b. The third comparator 222c may output a difference between the outputs of the first comparator 222a and the second comparator 222b as a feedback signal Vfb. This technique is more fully described below with reference to FIG. 11.

Figure 11:
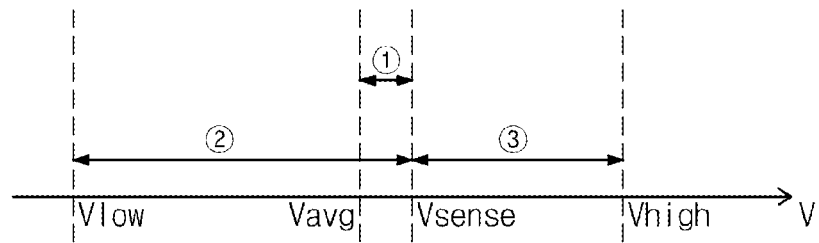
FIG. 11 is a graph describing a feedback signal generated from a feedback signal generating unit of FIG. 10.

FIG. 11 is a graph describing a feedback signal generated from a feedback signal generating unit of FIG. 10. In FIG. 11, a horizontal axis may indicate a voltage.

As described with reference to FIG. 10, a low reference voltage Vlow may be a voltage which a memory cell having a low resistance state outputs in response to a read current. A high reference voltage Vhigh may be a voltage which a memory cell having a high resistance state outputs in response to the read current. A sensing voltage Vsense may be a voltage which a sample cell 210 (e.g., of FIG. 9) outputs in response to the read current. An average voltage Vavg may be an average value of the low reference voltage Vlow and the high reference voltage Vhigh.

The sensing voltage Vsense may be compared with the average voltage Vavg to sense a resistance state of the sample cell 210. If the sensing voltage Vsense is higher than the average voltage Vavg, the sample cell 210 may be determined to be at a high resistance state. If the sensing voltage Vsense is lower than the average voltage Vavg, the sample cell 210 may be determined to be at a low resistance state. In this case, the feedback signal Vfb may be a difference between the average voltage Vavg and the sensing voltage Vsense. In FIG. 11, ① may indicate voltage margin for determining a resistance state of the sample cell 210.

Meanwhile, to sense a resistance state of the sample cell 210, the feedback signal generating unit 222 may compare a difference ② between the sensing voltage Vsense and the low reference voltage Vlow with a difference ③ between the high reference voltage Vhigh and the sensing voltage Vsense, instead of comparing of the sensing voltage Vsense and the average voltage Vavg.

The feedback signal Vfb generated by the feedback signal generating unit 222 may be calculated by the following equations.

$$Vo1 = Vhigh - Vsense \quad (1)$$

$$Vo2 = Vsense - Vlow \quad (2)$$

$$Vfb = Vo1 - Vo2 = 2(Vavg - Vsense) \quad (3)$$

Vo1 may indicate an output of a first comparator 222a. In other words, Vo1 may indicate a difference ③ between the high reference voltage Vhigh and the sensing voltage Vsense. Vo2 may indicate an output of a second comparator 222b. In other words, Vo2 may indicate a difference ② between the sensing voltage Vsense and the low reference voltage Vlow. The feedback signal Vfb may be generated in response to a difference between Vo1 and Vo2.

As understood from the equation 3, the feedback signal generating unit 222 may generate the feedback signal Vfb in response to a difference between Vo1 and Vo2. The feedback signal generating unit 222 may sense a resistance state of the sample cell 210 with double voltage margin compared with the case that the sensing voltage Vsense is compared with the average voltage Vavg. That is, the feedback signal generating unit 222 may sense a resistance state of the sample cell 210 with high voltage margin using a plurality of reference voltages generated from a plurality of reference cells.

Figure 12:
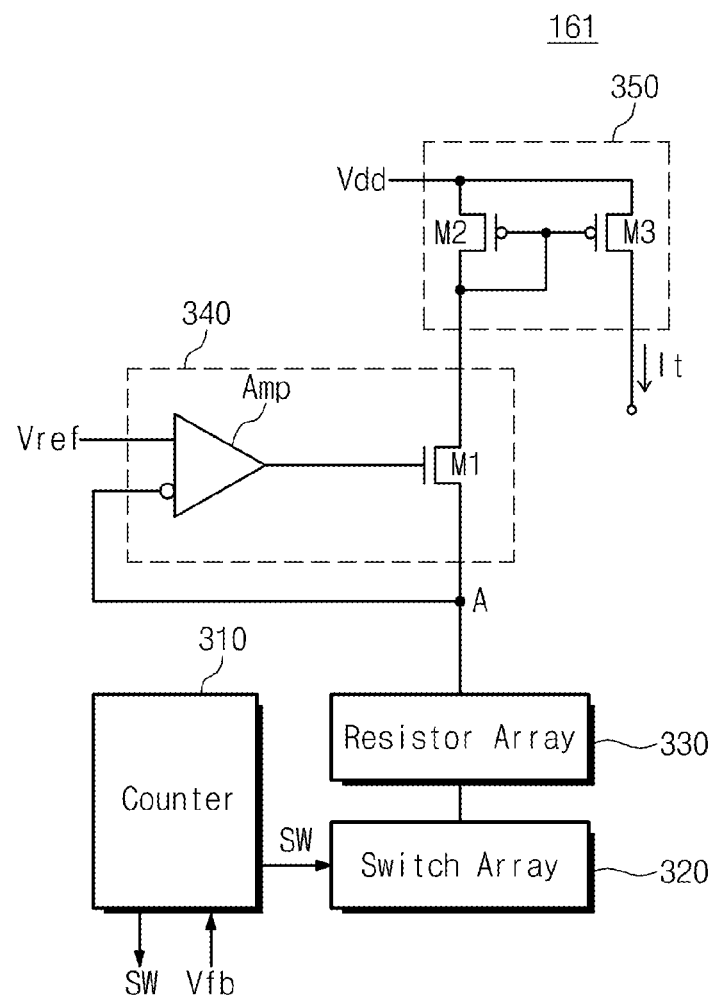
FIG. 12 is a circuit diagram schematically illustrating a current supplying circuit of FIG. 8.

FIG. 12 is a circuit diagram schematically illustrating a current supplying circuit of FIG. 8. Referring to FIG. 12, a current supplying circuit 161 may include a counter 310, a switch array 320, a resistor array 330, a voltage stabilizer 340, and a current mirror 350.

The counter 310 may control the switch array 320 using a switch signal SW. The counter 310 may determine a variation in a resistance state of a sample cell 210 (e.g., of FIG. 8) using a feedback signal Vfb from a calibration circuit 162 (e.g., of FIG. 8). The counter 310 may control the switch signal SW in response to a result of the determination. For example, if resistance state of the sample cell 210 is determined not to be varied, the counter 310 may control the switch signal SW such that the number of closed (i.e., turned on) switches from among switches in the switch array 320 increases.

Also, if resistance state of the sample cell 210 is determined to be varied, the counter 310 may store the switch signal SW used to change a resistance state of the sample cell 210. The counter 310 may provide a replica circuit 163 (e.g., of FIG. 8) with the switch signal SW stored therein.

The switch array 320 may include a plurality of switches that are connected in parallel. The switches in the switch array 320 may be connected between the resistor array 330 and ground. The switch array 320 may close or open a plurality of switches in response to the switch signal SW provided from the counter 310.

The resistor array 330 may include a plurality of resistors that are connected in parallel. Each of the resistors in the resistor array 330 may be connected between a node A and the switch array 320. Each of the resistors in the resistor array 330 may be connected in series with a corresponding one of the switches in the switch array 320. An effective resistance value of the resistor array 330 may be decided according to whether the switches of the switch array 320 are closed (i.e., turned on).

The voltage stabilizer 340 may include an amplifier Amp and a first transistor M1. The voltage stabilizer 340 may constantly maintain a voltage of the node A by a reference voltage Vref using the amplifier Amp and the first transistor M1. With a voltage maintaining operation of the voltage stabilizer 340, a current flowing through the first transistor M1 may be decided based on an effective resistance value of the resistor array 330.

The current mirror 350 may include second and third transistors M2 and M3. The current mirror 350 may copy a current flowing through the first transistor M1 to be output as a test current It.

As described above, a level of the test current It may be controlled by closing or opening of switches in the switch array 320. The counter 310 may control the switches in the switch array 320 such that a level of the test current It stepwise or otherwise incrementally increases until a state of the sample cell 210 varies.

The counter 310 may control the switch array 320 such that a level of the test current It is discretized to N bits. Such discretization is more fully described below with reference to FIG. 13.

Figure 13:
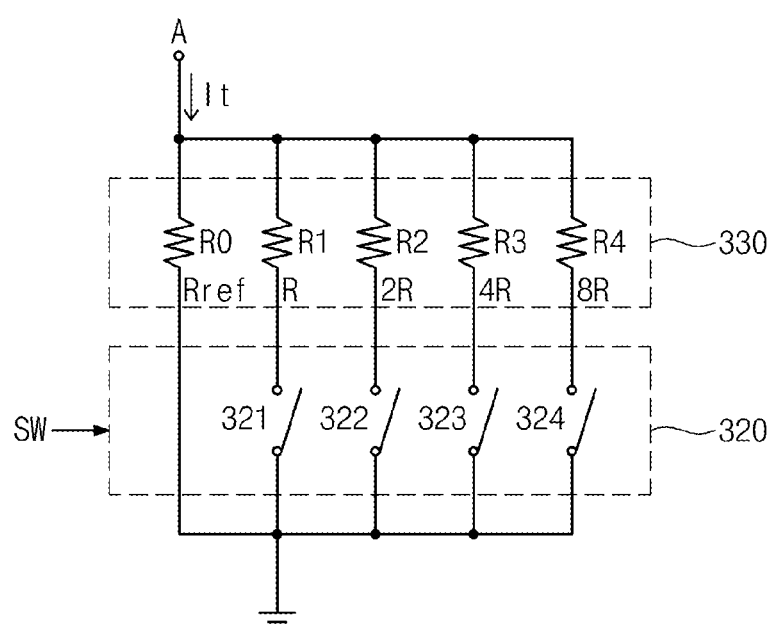
FIG. 13 is a circuit diagram schematically illustrating a switch array and a resistor array of FIG. 12.

FIG. 13 is a circuit diagram schematically illustrating a switch array and a resistor array of FIG. 12. In FIG. 13, the number of switches and the number of resistors may be exemplary. The inventive concept is not limited thereto.

Referring to FIG. 13, a switch array 320 may include first to fourth switches 321 to 324 that are connected in parallel. The resistor array 330 may include a reference resistor R0 and first to fourth resistors R1 to R4 that are connected in parallel. The first to fourth switches 321 to 324 of the switch array 320 may correspond to the first to fourth resistors R1 to R4 of the resistor array 330, respectively.

Assuming that a value of the reference resistor R0 is Rref and values of the first to fourth resistors R1 to R4 are $2^0 R$, $2^1 R$, $2^2 R$ and $2^3 R$, a current It flowing to a node A may be expressed by the following equation.

$$It = Iref + (b_1 b_2 b_3 b_{4(2)})Is \quad (4)$$

In the equation, Iref may indicate a current flowing through the reference resistor R0 and be calculated by the following equation 5. A current Is may be a current flowing through the fourth resistor R4 and be calculated by the following equation 6.

$$Iref = \frac{Va}{Rref} \quad (5)$$

-continued $$Is = \frac{Va}{8R} \quad (6)$$

In the equations (5) and (6), $(b_1b_2b_3b_{4(2)})$ may be a binary value of four bits decided by a switch signal SW, and a bit $b_k$ may indicate whether a kth switch is closed (i.e., turned on). For example, the bit $b_k$ may have a value of 1 when the kth switch is closed and a value of 0 when the kth switch is opened.

As described above, the switch array 320 and the resistor array 330 may be configured such that a level of the test current It is discretized to N bits. A counter 310 (e.g., of FIG. 12) may provide a discretized test current It to a calibration circuit 162 (e.g., of FIG. 8) using the switch signal SW.

Figure 14:
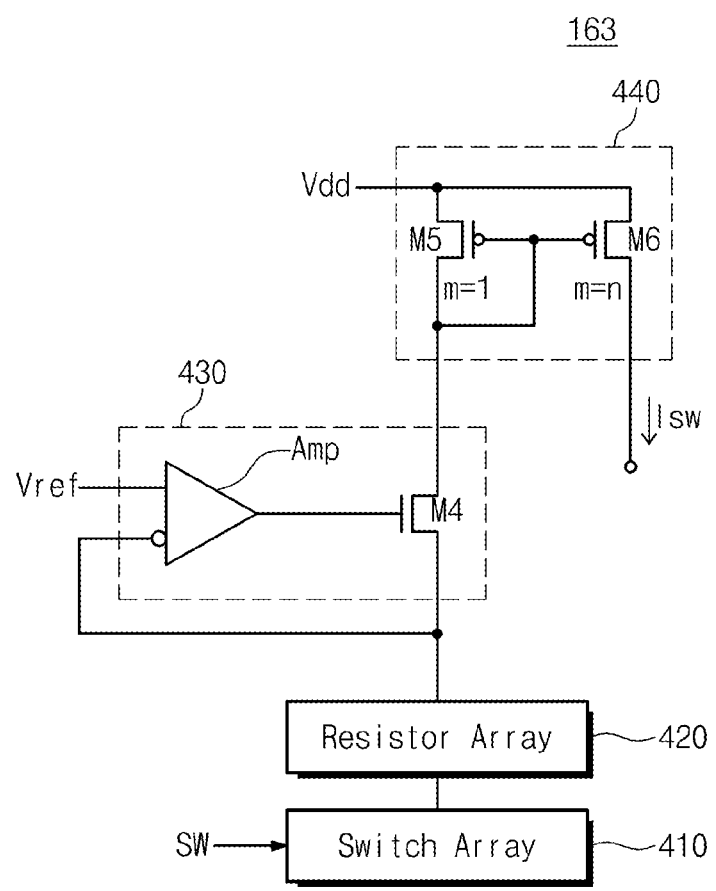
FIG. 14 is a circuit diagram schematically illustrating a replica circuit of FIG. 8 according to an embodiment of the inventive concept.

FIG. 14 is a circuit diagram schematically illustrating a replica circuit of FIG. 8 according to an embodiment of the inventive concept. Referring to FIG. 14, a replica circuit 163 may include a switch array 410, a resistor array 420, a voltage stabilizer 430, and a current mirror 440.

The switch array 410 may close or open a plurality of switches in response to a switch signal SW provided from a counter 310 of a current supplying circuit 161 (e.g., of FIG. 12).

The resistor array 420 may include a plurality of resistors that are connected in parallel. Each of the resistors in the resistor array 420 may be connected between a node A and the switch array 410. Each of the resistors in the resistor array 420 may be connected in series with a corresponding one of the switches in the switch array 410. An effective resistance value of the resistor array 420 may be decided according to whether one or more switches from among switches of the switch array 410 are closed (i.e., turned on).

The voltage stabilizer 430 may include an amplifier Amp and a fourth transistor M4. The voltage stabilizer 430 may constantly maintain a voltage of the node A by a reference voltage Vref using the amplifier Amp and the fourth transistor M4. With a voltage maintaining operation of the voltage stabilizer 430, a current flowing through the fourth transistor M4 may be based on an effective resistance value of the resistor array 420.

The current mirror 440 may include fifth and sixth transistors M5 and M6. The current mirror 440 may have a current gain of n. The current mirror 440 may copy (i.e., mirror) a current flowing through the fourth transistor M4, or a multiple thereof. For example, the current mirror 440 may output a switching current Isw n times higher in level than the copied (i.e., mirrored) current.

As described above, a current flowing to the fourth transistor M4 may be based on an effective resistance value of the resistor array 420. The effective resistance value of the resistor array 420 may be decided in response to a switch signal SW. The replica circuit 163 may provide a stabile current having a level that is n times higher than a switching current of a sample cell 210, using the switch signal SW provided from a counter 310.

Figure 15:
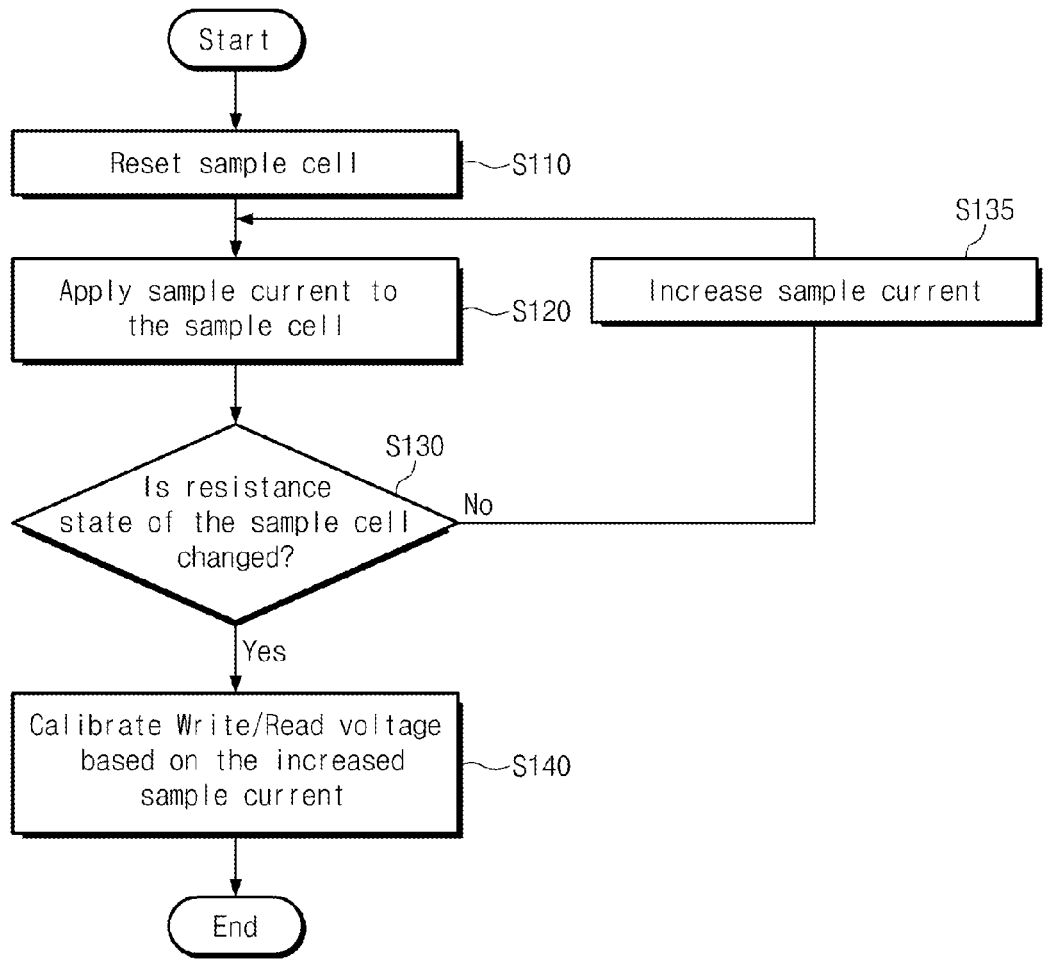
FIG. 15 is a flow chart illustrating a read/write current calibrating method of a nonvolatile memory device according to an embodiment of the inventive concept.

FIG. 15 is a flow chart illustrating a read/write current calibrating technique of a nonvolatile memory device according to an embodiment of the inventive concept. A nonvolatile memory device may include a sample cell and first and second comparators, which may be used to track a variation in a physical characteristic of a memory cell.

In operation S110, a sample cell may be reset. A resistance state of the sample cell may be rest by a reset current provided from a reset current source, as described in detail above.

In operation S120, a sample current may be applied to the sample cell. The sample current may be a write current provided from a current supplying circuit to change a resistance state of the sample cell, as also described in detail above.

In operation S130, a determination can be made whether or not a resistance state of the sample cell varies. In other words, a determination can be made whether the sample cell is changed from one resistance state to another (e.g., from a logical 1 to a logical 0, vice versa). A resistance state of the sample cell may be determined using the first and second comparators. Specifically, the first comparator may compare a sample voltage, which the sample cell generates in response to a read current, with a first reference voltage, to generate a first output voltage. The second comparator may compare the sample voltage with a second reference voltage, to generate a second output voltage. A resistance state of the sample cell may be determined by comparing the first and second output voltages.

The first reference voltage may be a voltage which a cell having a low resistance state generates in response to the read voltage. The second reference voltage may be a voltage which a cell having a high resistance state generates in response to the read voltage.

If a resistance state of the sample cell is determined not to vary, in operation S135, the sample current may be increased. The sample current may be discretized. In other words, the sample current may be provided in discrete levels. Also, the sample current may be stepwise or otherwise incrementally increased. In addition, an increasing frequency of the sample current may be counted.

In operation S140, a read/write current of the nonvolatile memory device may be calibrated based on the increased sample current. The read/write current of the nonvolatile memory device can be calibrated based on the increasing frequency of the sample current counted in operation S135.

The read/write calibrating operation may be performed at a start-up operation of the nonvolatile memory device. Alternatively, the read/write calibrating operation may be periodically performed every predetermined time interval.

With the read/write calibrating technique, the nonvolatile memory device may self-calibrate the read and write currents periodically. For the self-calibration operation, the nonvolatile memory device may sense a resistance state of a sample cell using reference cells having a plurality of resistance states. The calibrating technique may include setting the actual read and/or write currents based on the sample current that caused the sample cell to change states. For example, in a write operation, the write current may be set to be equal to, substantially equal to, or greater than the sample current that caused the sample cell to change states. By way of another example, in a read operation, the read current may be set to be less than the sample current that caused the sample cell to change states.

Figure 16:
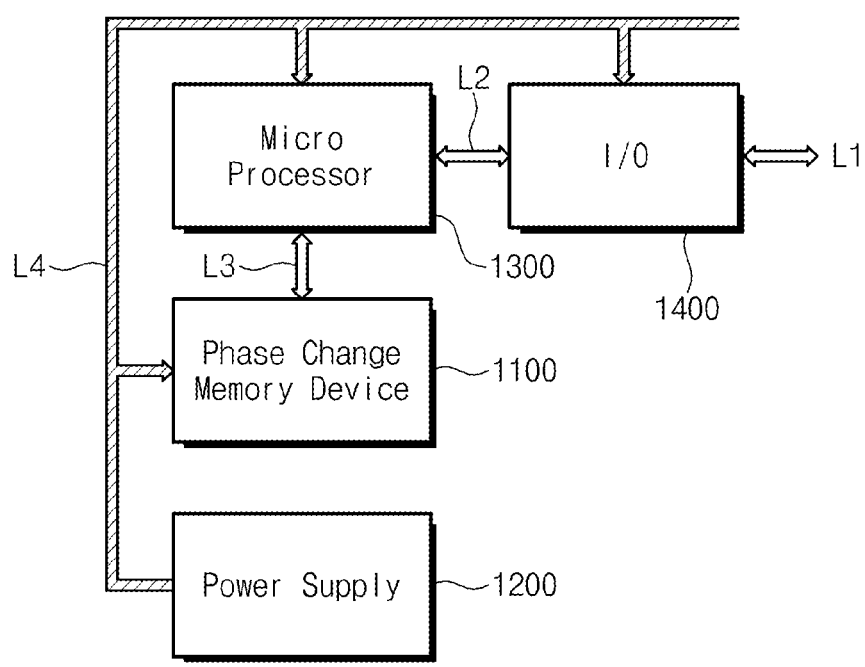
FIG. 16 is a block diagram schematically illustrating a portable electronic system including a phase change memory device being a nonvolatile memory device according to an embodiment of the inventive concept.

FIG. 16 is a block diagram schematically illustrating a portable electronic system including a phase change memory device being a nonvolatile memory device according to an embodiment of the inventive concept.

A phase change memory device 1100 may include a sample cell having the same condition as a memory cell of a cell array. The phase change memory device 1100 may self-calibrate read and write currents, used to process data, based on the sample cell.

For the self-calibration operation, the phase change memory device 1100 may sense a resistance state of a sample cell using reference cells having a plurality of resistance states. Since the phase change memory device 1100 self-calibrates the read and write currents, physical variations of memory cells may be calibrated at read and write operations.

The phase change memory device 1100 connected with a microprocessor 1300 through a bus line L3 may be provided as a main memory portable electronic system. A power supply 1200 may supply a power to the microprocessor 1300, an input/output device 1400 and the phase change memory device 1100 through a power line L4. The components 1300 and 1400 may form a memory controller for controlling the phase change memory device 1100.

In the event that input data is provided to the input/output device 1400 through a line L1, the microprocessor 1300 may process data received through a line L2 to transfer the input or processed data to the phase change memory device 1100 through the bus line L3. The phase change memory device 1100 may store data provided through the bus line L3 at memory cells. Also, data stored at memory cells may be read out by the microprocessor 1300, and the read data may be output to an external device through the input/output device 1400.

In the event that a power of the power supply 1200 is not supplied to the power line L4, data stored at the phase change memory device 1100 may not be lost according to a characteristic of phase change material. Unlike a DRAM, the phase change memory device 1100 may be a nonvolatile memory. Besides, compared with other memory devices, the phase change memory device 1100 may be advantageous in terms of a fast operating speed and low power consumption.

Figure 17:
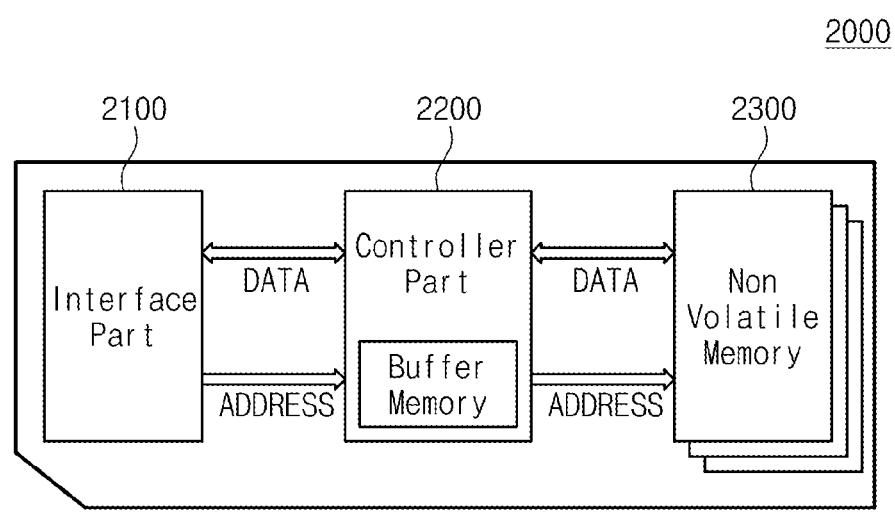
FIG. 17 is a block diagram schematically illustrating a memory card including a nonvolatile memory device according to an embodiment of the inventive concept.

FIG. 17 is a block diagram schematically illustrating a memory card including a nonvolatile memory device according to an embodiment of the inventive concept. A memory card 2000, for example, may be an MMC card, an SD card, a multiuse card, a micro-SD card, a memory stick, a compact SD card, an ID card, a PCMCIA card, an SSD card, a chip-card, a smartcard, an USB card, or the like.

Referring to FIG. 17, the memory card 2000 may include an interface circuit 2100 for interfacing with an external device, a controller 2200 including a buffer memory. The controller 2200 may control an operation of the memory card 2000, and at least one nonvolatile memory device 2300 according to an embodiment of the inventive concept. The controller 2200 may be or otherwise include a processor, which is configured to control write and read operations of the nonvolatile memory device 2300. The controller 2200 may be coupled with the nonvolatile memory device 2300 and the interface circuit 2100 via a data bus and an address bus.

The nonvolatile memory device 2300 may include a sample cell having the same condition as a memory cell of a cell array. The nonvolatile memory device 2300 may self-calibrate read and write currents, used to process data, based on the sample cell, as explained in detail above. For the self-calibration operation, the nonvolatile memory device 2300 may sense a resistance state of a sample cell using reference cells having a plurality of resistance states. Since the nonvolatile memory device 2300 self-calibrates the read and write currents, physical variations of memory cells may be calibrated at read and write operations.

Figure 18:
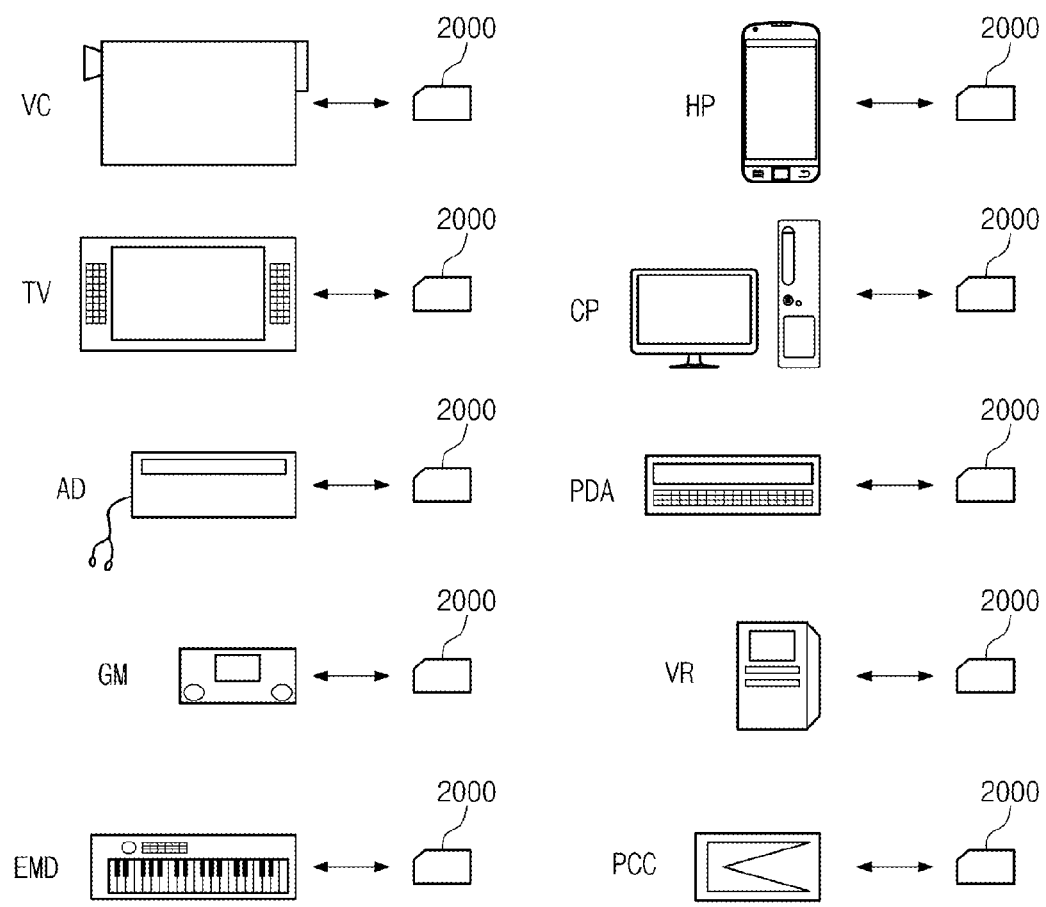
FIG. 18 is a diagram schematically illustrating various systems to which a memory card in FIG. 17 is applied.

FIG. 18 is a diagram schematically illustrating various systems to which a memory card in FIG. 17 is applied. Referring to FIG. 18, a memory card 2000 may be applied to a video camera VC, a television TV, an audio device AD, a game machine GM, an electronic music device EMD, a cellular phone HP, a computer CP, a Personal Digital Assistant (PDA), a voice recorder VR, a PC card PCC, and the like.

A non-volatile memory device according to the inventive concept may be packed using various types of packages. For example, A non-volatile memory device or a memory controller according to the inventive concept may be packed using packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The inventive concept may be modified or changed variously. For example, detailed structures of a calibration circuit, a current supplying circuit, and a replica circuit may be changed or modified variously according to environment and use.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A current generator for generating current in a nonvolatile memory device, the current generator comprising:
    a current supplying circuit configured to gradually and incrementally change a level of a sample current from one discrete level to another; and
    a calibration circuit coupled to the current supplying circuit, wherein the calibration circuit includes a sample bit cell configured to receive the sample current, and wherein the calibration circuit further includes a feedback signal generating unit configured to generate and transmit a feedback signal to the current supplying circuit indicating a resistance state change current of the sample bit cell,
    wherein the current supplying circuit is configured to determine the resistance state change current of the sample bit cell based on the feedback signal obtained from the calibration circuit, and
    wherein the sample bit cell is configured to receive a discrete level of the sample current to change a resistance state of the sample bit cell.

2. The current generator of claim 1, wherein the current supplying circuit is further configured to calibrate at least one of a write current and a read current of a memory cell, in response to the discrete level of the sample current that is applied at a point of time corresponding to when the resistance state of the sample bit cell is switched into another resistance state.

3. The current generator of claim 1, wherein the calibration circuit is configured to generate the feedback signal indicating a resistance area of a predetermined resistance range to which the resistance state of the sample bit cell belongs.

4. The current generator of claim 1, wherein:
    the sample bit cell is configured to output a sample voltage; and
    the feedback signal generating unit is configured to:
        compare the sample voltage with a voltage associated with a predefined high resistance bit cell so as to generate a first output voltage;
        compare the sample voltage with a voltage associated with a predefined low resistance bit cell so as to generate a second output voltage; and
        to compare the first and second output voltages so as to generate the feedback signal.

5. The current generator of claim 1, wherein the nonvolatile memory device is a spin transfer torque magnetoresistive random access memory device.

6. The current generator of claim 1, wherein the calibration circuit further comprises:
a reset current source configured to reset the sample bit cell.

7. The current generator of claim 1, wherein the current supplying circuit further comprises:
a counter configured to increase the sample current until the resistance state of the sample bit cell is switched into another resistance state, and to generate a count value based on an increasing frequency of the sample current; and
a replica circuit configured to provide a write current that is calibrated based on the count value.

8. The current generator of claim 7, wherein the current supplying circuit further comprises:
a resistor array including a plurality of resistors connected in parallel; and
a switch array including a plurality of switches, each of the switches being connected in series to a corresponding one of the plurality of resistors, the switch array being configured to turn one or more of the switches on in response to a control of the counter.

9. The current generator of claim 8, wherein the resistor array is configured such that a total level of current flowing to the plurality of resistors is discretized.

10. The current generator of claim 8, wherein the current supplying circuit further comprises:
a voltage stabilizer configured to maintain a voltage provided to the plurality of resistors.

11. The current generator of claim 10, wherein the voltage stabilizer further comprises:
an error amplifier configured to amplify a difference between a reference voltage and the voltage provided to the plurality of resistors.

12. The current generator of claim 7, wherein the replica circuit further comprises:
a replica resistor array including a plurality of resistors connected in parallel; and
a replica switch array including a plurality of switches, each of the switches being connected in series to a corresponding one of the plurality of resistors, the replica switch array being configured to turn one or more of the switches on in response to a control of the counter based on the count value.

13. A current calibrating method of a nonvolatile memory device, the memory device including a sample cell, a first comparator, and a second comparator, the method comprising:
gradually and incrementally changing a sample current applied to the sample cell until a resistance state of the sample cell is changed; and
calibrating at least one of a write current and a read current of the nonvolatile memory device in response to the changed sample current,
wherein changing the sample current further comprises:
generating, by the sample cell, a sample voltage in response to a read current;
comparing, by the first comparator, the sample voltage with a first reference voltage;
outputting a first output voltage in response to the comparing;
comparing, by the second comparator, the sample voltage with a second reference voltage;
generating a second output voltage in response to the comparing; and
determining the resistance state of the sample cell by comparing the first output voltage and the second output voltage.

14. The method of claim 13, further comprising:
providing a reset current to the sample cell; and
resetting the resistance state of the sample cell.

15. The method of claim 13, further comprising:
calculating a count value based on a varying frequency of the sample current, and
wherein calibrating further comprises calibrating the at least one of the write current and the read current of the nonvolatile memory device based on the count value.

16. The method of claim 13, wherein gradually and incrementally changing the sample current includes stepwise changing the sample current so that the sample current is increased by a discretization level until a resistance state of the sample cell is changed.

17. The method of claim 13, wherein calibrating further includes periodically calibrating the at least one of the write current and the read current of the nonvolatile memory device at predetermined time intervals.

18. The method of claim 13, wherein calibrating further includes periodically calibrating the at least one of the write current and the read current at a start-up operation of the nonvolatile memory device.

* * * * *